United States Patent [19]
Choi et al.

[11] Patent Number: 6,111,789
[45] Date of Patent: Aug. 29, 2000

[54] NONVOLATILE SEMICONDUCTOR MEMORY DEVICE

[75] Inventors: Ki-Hwan Choi, Seoul; Young-Ho Lim, Kyunggi-do, both of Rep. of Korea

[73] Assignee: Samsung Electronics, Cot., Ltd., Suwon, Rep. of Korea

[21] Appl. No.: 09/388,833

[22] Filed: Sep. 1, 1999

[30] Foreign Application Priority Data

Sep. 17, 1998 [KR] Rep. of Korea ............... 98-38529

[51] Int. Cl.$^7$ .................................. G11C 16/06

[52] U.S. Cl. ............... 365/185.22; 365/185.24; 365/189.11

[58] Field of Search ............ 365/185.22, 185.24, 365/189.11, 189.06

[56] References Cited

U.S. PATENT DOCUMENTS 5,530,675  6/1996  Hu ............................................. 365/218
5,661,685  8/1997  Lee et al. .............................. 365/185.22

Primary Examiner—Vu A. Le
Attorney, Agent, or Firm—Marger Johnson & McCollom, P.C.

[57] ABSTRACT

Disclosed is a nonvolatile semiconductor memory device, operated under various modes of operation, which comprises a high voltage generating circuit, a word line voltage switching circuit, and a charge sharing circuit. The voltage switching circuit transfers to a row decoder circuit one of the various voltages corresponding to a selected mode of operation, and the charge sharing circuit is connected to an output node of the high voltage generating circuit. Further, when the memory device enters a program verify mode of operation from a program mode of operation, the charging sharing circuit lowers a word line voltage from a program voltage to a program verify voltage without charge loss, by means of charge sharing.

16 Claims, 7 Drawing Sheets

NONVOLATILE SEMICONDUCTOR MEMORY DEVICE

FIELD OF THE INVENTION

The present invention relates to a nonvolatile semiconductor memory device, and more particularly to a NOR-type flash memory device having electrically erasable and programmable read-only memory cells.

BACKGROUND OF THE INVENTION

In recent years, flash memory devices, i.e., nonvolatile semiconductor memory devices in which a program operation and an erase operation are performed electrically, have begun to be used in battery-powered portable electronics. Since integrated circuit chips used in portable electronics are being designed to operate at lower voltage, it is desirable that flash memory devices incorporated in portable electronics consume less power. Also, it is required that the erase/program operation of the flash memory device be performed rapidly despite the low operating voltage.

As is well known, when the program/erase operation of a flash memory device is performed, a voltage (hereinafter, referred to as a high voltage Vpp) higher than the power supply voltage is used. The high voltage Vpp is not provided externally, but is instead generated in the flash memory device by use of a high voltage generator (for example, a charge pump circuit). In a charge pump circuit, the pumping efficiency—defined as a ratio of pumping current (pumped voltage) to consumed power current (voltage)—is about 10%. Thus, considerable power is consumed by the flash memory device's on-chip high voltage generator. Therefore, in order to realize a low-power flash memory device, a method capable of effectually controlling the high voltage Vpp, which is used at a program/erase operation of the flash memory device, is required.

Referring to FIG. 1, a block diagram of a conventional flash memory device is illustrated. In FIG. 1, the reference numbers 10, 12, 14, and 16 indicate a memory cell array, an address buffer circuit, a row decoder circuit, and a column decoder circuit, respectively. And, the reference numbers 18, 20, and 22 indicate a high voltage generator, a mode setting signal generator, and a word line voltage switching circuit, respectively. A circuit diagram showing a part of the memory cell array 10 and detailed circuits of the high voltage generator 18, the mode setting signal generator 20, and the word line voltage switching circuit 22, together with the row decoder circuit 14, is illustrated in FIG. 2.

In FIG. 2, reference number 11 indicates memory cells (for example, ETOX-type cells) arranged in matrix form, and reference number 12 indicates word lines to which gates of memory cells 11 in the same row of array 10 are connected in common. Reference number 13 indicates bit lines that are arranged perpendicular to word lines 12, and that are connected in common to drain regions of memory cells 11 in the same column of array 10. Reference number 15 indicates source lines (as well known, a ground voltage is provided into 14) that are connected in common to source regions of memory cells 11 in the same row of array 10.

In memory cell array 10, during a read mode of operation, a power supply voltage (for example, 5V) is applied to a word line 12, and an intermediate voltage (for example, 1V) is applied to a bit line 13. During a program mode of operation, the high voltage Vpp (for example, 10V) is applied to word line 12, and the power supply voltage is applied to bit line 13. During an erase mode of operation, a negative voltage (for example, −10V) is applied to all of the word lines 12, and the bit lines 13 and the source lines 15 are maintained in a floating state.

Continuing to refer to FIG. 2, the high voltage Vpp applied to the word line during the read and program modes of operation is generated in high voltage generator 18. High voltage generator 18 operates from the power supply voltage VCC, and produces the high voltage Vpp having a voltage level required at the respective modes of operation. The high voltage Vpp from generator 18 is applied via word line switching circuit 22 to a word line selected by row decoder circuit 14. Word line voltage switching circuit 22 transfers to the row decoder circuit 14 either power supply voltage VCC or high voltage Vpp (from high voltage generator 18) depending on the state of a mode setting signal MODE received from mode setting signal generator 20.

As illustrated in FIG. 2, mode setting signal generator 20 is composed of two NOR gates 50 and 51. NOR gate 50 has two input terminals for receiving signals PGM and PGMVFY, and NOR gate 51 outputs mode setting signal MODE by NORing the output of NOR gate 50 and a signal DIS. The signal PGM indicates a program mode of operation, the signal PGMVFY indicates a program verification mode of operation, and the signal DIS indicates a word line voltage discharge operation. Word line voltage switching circuit 22 is composed of two level shifters 52 and 53 and two PMOS transistors 54 and 55, connected as shown in FIG. 2.

FIG. 3 is a flowchart showing processor steps of a program operation associated with the NOR-type flash memory device illustrated in FIG. 2, and FIG. 4 is a diagram showing word line voltage changes during program mode operation. Programming operation of a conventional flash memory device will be more fully described below with reference to the accompanying drawings. For ease of description, a programming operation associated with only one memory cell 11 will be described.

When a program operation is initiated, a program verification operation is first performed in step S10 in order to discriminate whether a memory cell needs to be programmed. Herein, in the case where memory cell 11 is an on-cell, the threshold voltage of the memory cell is between 1V and 3V. If it is an off-cell, the threshold voltage thereof is between 6V and 7V. During the program verification operation, a program verification voltage of about 6V, for example, is applied to the word line 12 to which the gate of memory cell 11 is connected. At the same time, a sensing current is supplied onto the bit line 13 associated with memory cell 11.

In particular, in step S 10, the signals PGM, PGMVFY, and DIS are set at a logic low level, a logic high level, and a logic low level, respectively, as illustrated in FIG. 4. This forces mode setting signal generator 20 to generate a logic high level at mode setting signal MODE, so that PMOS transistor 54 of circuit 22 is turned off and NMOS transistor 55 thereof is turned on. Accordingly, the high voltage Vpp (that is, a program verification voltage of about 6V) generated in high voltage generator 18 is supplied to word line 12 via turned-on transistor 55 and row decoder circuit 14.

In a subsequent step S12, it is determined whether the memory cell 11 is an on-cell or an off-cell. If it is an off-cell, the program operation is ended. In the case where the memory cell is an off-cell, it has a threshold voltage of about 6 to 7V, and during a verify operation, the voltage level on the bit line becomes higher than a precharged voltage level.

If the memory cell 11 is an on-cell (i.e., it has a threshold voltage of about 1 to 3V and during a verify operation, voltage level on the bit line becomes lower than the precharged voltage level), the procedure continues at step S14. At step S14, a program operation is performed to set memory cell 11's threshold voltage to about 6 to 7V (corresponding to an off-cell). During the program operation, the high voltage Vpp (that is, a program voltage of about 10V) generated in high voltage generator 18 is supplied to the word line 12 associated with memory cell 11, and a voltage of about 5V is supplied to the bit line 13 associated with memory cell 11. Also, the source line 15 connected to the source of memory cell 11 is grounded.

In particular, since the signals PGM, PGMVFY, and DIS are set respectively at a logic high level, a logic low level, and a logic low level during the program operation, the mode setting signal MODE remains at a logic high level. This enables PMOS transistor 54 of circuit 22 to be turned off and NMOS transistor 55 thereof to be turned on. As a result, the program voltage of about 10V is supplied to word line 12 via turned-on transistor 55 and row decoder circuit 14. The above-described voltage condition is maintained for a predetermined time. As is well known in the art, during programming hot electrons having high energy are injected into a floating gate from a channel region adjacent to the drain of memory cell 11. Hot electron injection increases the threshold voltage of memory cell 11.

In a subsequent step S16, the program verification operation is performed again (herein, as shown in FIG. 4, the voltage supplied to the word line is lowered from 10V to 6V). At step S18, it is determined whether the program step was successful. If the memory cell 11 is an off-cell, the program operation is ended. Otherwise, the procedure steps to S19, where it is determined whether the program operation has been performed a predetermined maximum number of times. If not, a loop counter is incremented at step S20 and control is passed back to step S14. If the maximum loop count is exceeded, the program operation control is terminated.

The program operation is performed as described above when a word line discharge operation is performed prior to step S16. During the discharge operation, the word line is discharged from the program voltage of about 10V down to the power supply voltage VCC. During the discharge operation, the signals PGM, PGMVFY, and DIS applied to mode setting signal generator 20 are set at a logic high level, a logic low level, and a logic high level, respectively, as illustrated in FIG. 4. Mode setting signal generator 20 produces a logic low level at signal MODE in response to the signals PGM, PGMVFY, and DIS. This makes PMOS transistor 55 of circuit 22 turn off and PMOS transistor 54 thereof turn on. Therefore, the program voltage of about 10V on word line 12 is lowered to the power supply voltage VCC via turned-on transistor 54. After this, the program verification operation will be performed as described above.

If the program voltage of about 10V has not discharged to the program verification voltage of about 6V or the power supply voltage of about 5V before the intended time for the program verification operation, the program verification operation is delayed until the voltage on the word line is discharged to 6V. The word line also originates various leakage current. This slows the overall operation speed of the flash memory device. Therefore, before the program verification operation can be performed after a program operation, the voltage on the word line must be discharged to the same voltage as the program verification voltage or lower. This problem always exists when the voltage supplied on a word line at one operation mode is higher than the voltage to be supplied on the word line at the next operation mode.

Whenever a discharge operation is performed, the program verification voltage has to be generated from high voltage generator 18 because the voltage on the word line drops below the program verification voltage when the discharge operation is performed. This consumes power in the flash memory device, particularly with a low pumping efficiency high voltage generator 18. In FIG. 4, the hatched portion indicates the amount of charge consumed by the discharge operation. Therefore, as the number of repeated program operations increases, the power consumed by the conventional flash memory device may increase considerably.

SUMMARY OF THE INVENTION

It is therefore an object of the present invention to provide a nonvolatile semiconductor memory device capable of producing a program verification voltage with minimal charge loss when the device enters a program verification operation from a program operation.

In order to attain the above object, according to one aspect of the present invention, there is provided a semiconductor memory device operated under various modes of operation. The device comprises at least one word line to which a plurality of memory cells for storing data information are connected; a voltage generating circuit having an output node, for receiving a power supply voltage and generating various voltages higher than the power supply voltage in accordance with the various modes of operation; a voltage switching circuit for transferring one of the various voltages corresponding to a selected mode of operation onto the word line; and a charge sharing circuit connected to the output node of the voltage generating circuit.

In the memory device according to the present invention, the charge sharing circuit preferably comprises a capacitor having first and second electrodes, the first electrode connected to the output node of the voltage generating circuit; a first transistor having a current path connected across the capacitor and a gate for receiving a control signal supplied through two serially-connected inverter circuits; and a second transistor having a current path connected between the second electrode and a ground, and a gate for receiving the control signal.

BRIEF DESCRIPTION OF THE DRAWINGS

The present invention will be described by way of exemplary embodiments illustrated in the accompanying drawings in which like references denote similar elements, and in which.

DESCRIPTION OF THE PREFERRED EMBODIMENT

A preferred embodiment of the present invention will be more fully described below with reference to the accompanying drawings.

Figure 1:
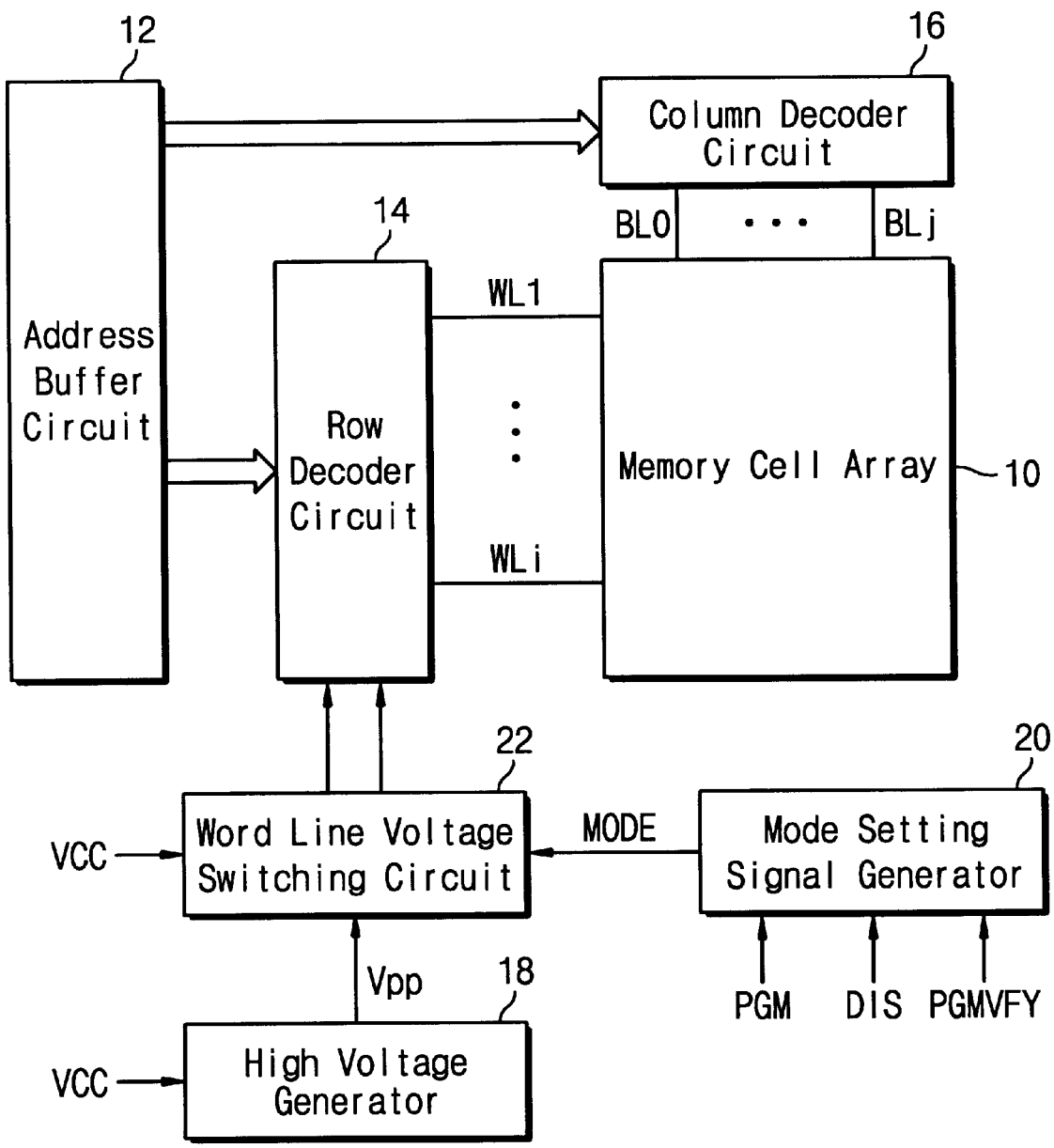
FIG. 1 shows a block diagram of a conventional nonvolatile semiconductor memory device.
Figure 5:
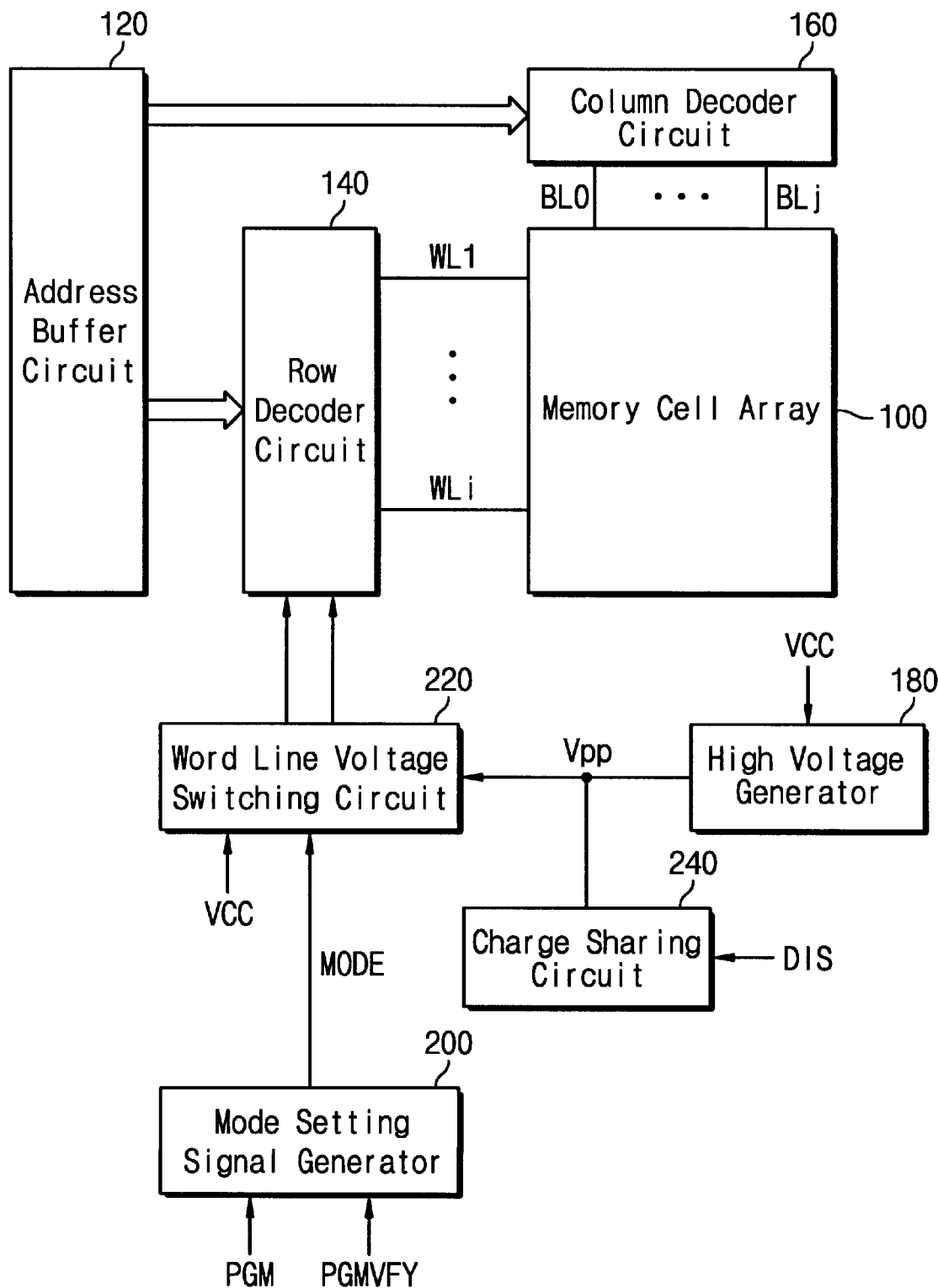
FIG. 5 shows a block diagram of a nonvolatile semiconductor memory device according to an embodiment of the present invention.

FIG. 5 is a block diagram of a flash memory device according to the present invention. In FIG. 5, the flash memory device comprises a memory cell array 100, an address buffer circuit 120, a row decoder circuit 140, a column decoder circuit 160, a high voltage generator 180, and a word line voltage switching circuit 220. These elements of FIG. 5 are identical to those of FIG. 1, and description thereof is thus omitted. The flash memory device of the present invention further comprises a mode setting signal generator 200 and a charge sharing circuit 240, as will be more fully described below.

Figure 2:
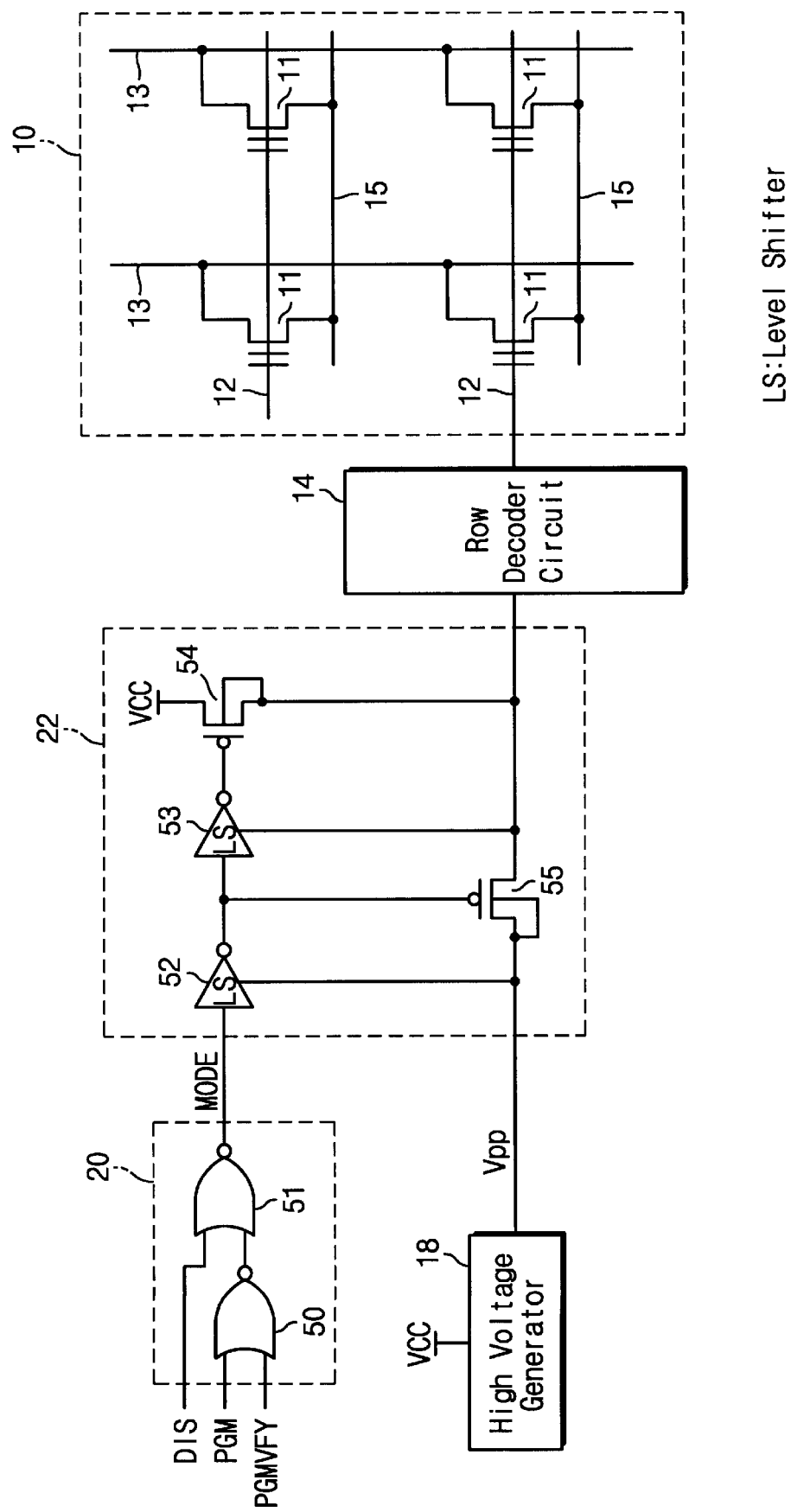
FIG. 2 shows a detailed circuit diagram of a mode setting signal generator and a word line voltage switching circuit illustrated in FIG. 1.
Figure 6:
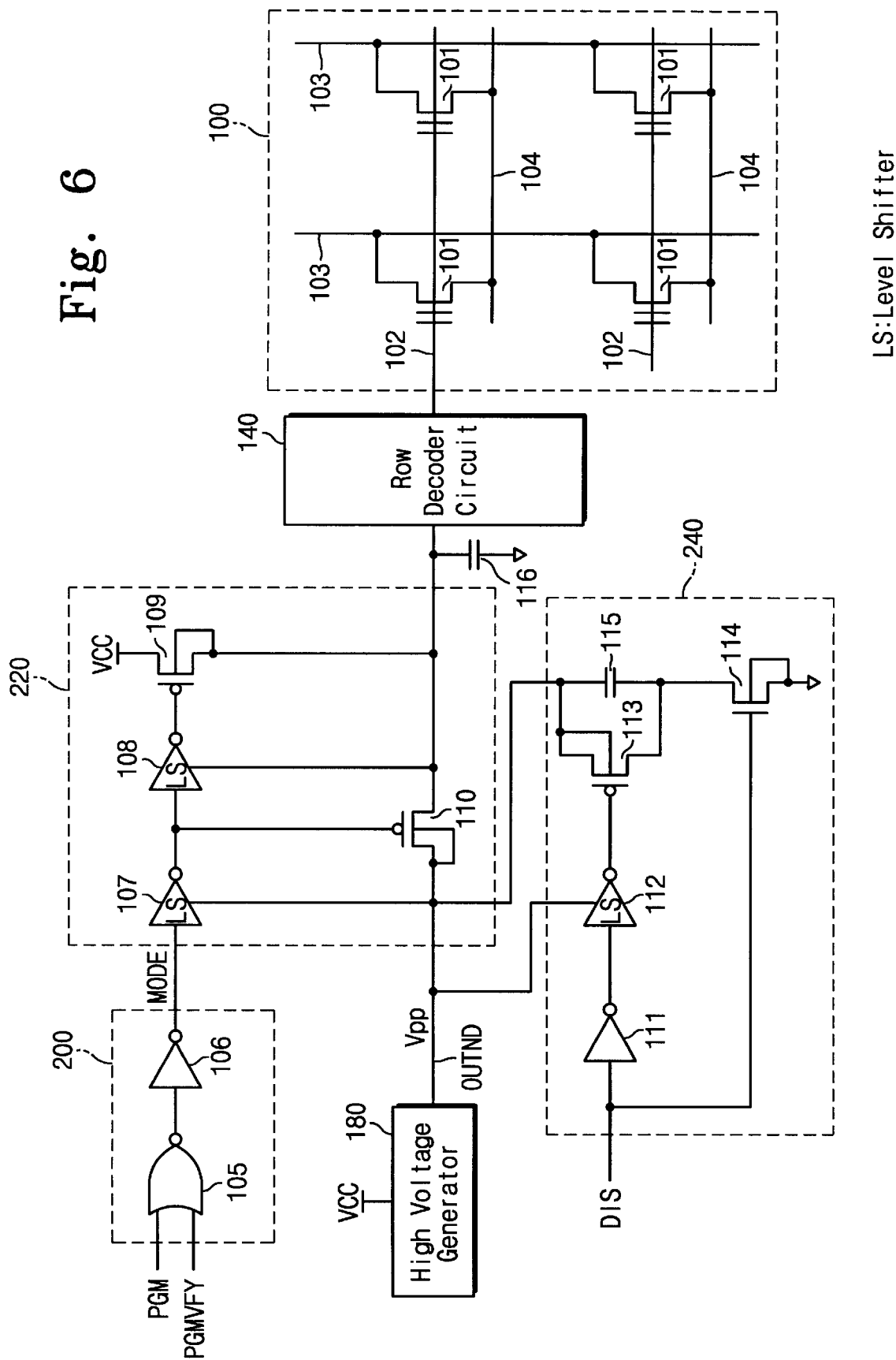
FIG. 6 is a preferred embodiment of a mode setting signal generator, a word line voltage switching circuit, and a charge sharing circuit according to the present invention.

A circuit diagram showing a part of the memory cell array 100 and detailed circuits of the high voltage generator 180, the mode setting signal generator 200, the word line voltage switching circuit 220, and the charge sharing circuit 240 is illustrated together with the row decoder circuit 140 in FIG. 6. Since the memory cell array 100 is identical to that of FIG. 2, description thereof is thus omitted.

Referring to FIG. 6, the high voltage generator 180 receives a power supply voltage VCC, and produces a high voltage Vpp at an appropriate voltage level during each of the respective modes of operation (for example, a program voltage of about 10V and a program verification voltage of about 6V). The high voltage Vpp thus generated is supplied via the word line voltage switching circuit 220 and the row decoder circuit 140 to a word line 102 in a program/read mode of operation. The word line voltage switching circuit 220 transfers to the word line 102 the high voltage Vpp or the power supply voltage VCC through the row decoder circuit 140 in response to a mode setting signal MODE from the mode setting signal generator 200.

As illustrated in FIG. 6, the mode setting signal generator 200 is comprised of one NOR gate 105 and one inverter 106. The NOR gate 105 has its input terminals connected to the signals PGM and PGMVFY, and the inverter 106 inverts the output of NOR gate 105 to produce the mode setting signal MODE. As described above, the signal PGM indicates a program mode of operation, and the signal PGMVFY indicates a program verification mode of operation. When a program operation is performed, the signals PGM and PGMVFY remain high and low, respectively, so that the mode setting signal MODE goes high. When a program verification operation is performed, the signals PGM and PGMVFY remain low and high, respectively, so that the signal MODE goes high. And, when a discharge operation is performed, signals PGM and PGMVFY are both low, such that the signal MODE goes low.

The word line voltage switching circuit 220 is comprised of two level shifters 107 and 108, and two PMOS transistors 109 and 110. The channel of PMOS transistor 110 is connected between the output node OUTND of the high voltage generator 180 and the row decoder circuit 140, and the gate of transistor 110 receives a level-shifted version of mode setting signal MODE from level shifter 107. PMOS transistor 109 has its channel connected between the power supply voltage VCC and output node OUTND via the transistor 110, and its gate connected to the output of level shifter 108. As is well known, each of level shifters 107 and 108 produces an output signal that has a phase complementary to that of its input signal, and also converts the voltage level of the inverted input signal to a new reference, e.g., Vpp from the high voltage generator 180.

Continuing to refer to FIG. 6, the charge sharing circuit 240 of the present invention is connected to output node OUTND and responds to the signal DIS. In one state, circuit 240 shares charge with load capacitor 116 (by dividing a voltage across the load capacitor 116). Load capacitor 116 connects between a word line 102 and output node OUTND, generator 180, such that the voltage (for example, a program voltage) on the word line is lowered by the activation of circuit 240. Circuit 240 is comprised of an inverter 111, a level shifter 112, a PMOS transistor 113, an NMOS transistor 114, and a capacitor 115. Level shifter 112 receives an inverted version of signal DIS from inverter 111, and uses the voltage Vpp as its power supply voltage. The channel of PMOS transistor 113 is connected across the electrodes of capacitor 115, and transistor 113's gate is coupled to the output of level shifter 112. The channel of NMOS transistor 114 is coupled between an electrode of capacitor 115 and the ground voltage, and transistor 114's gate is coupled to signal DIS.

Figure 7:
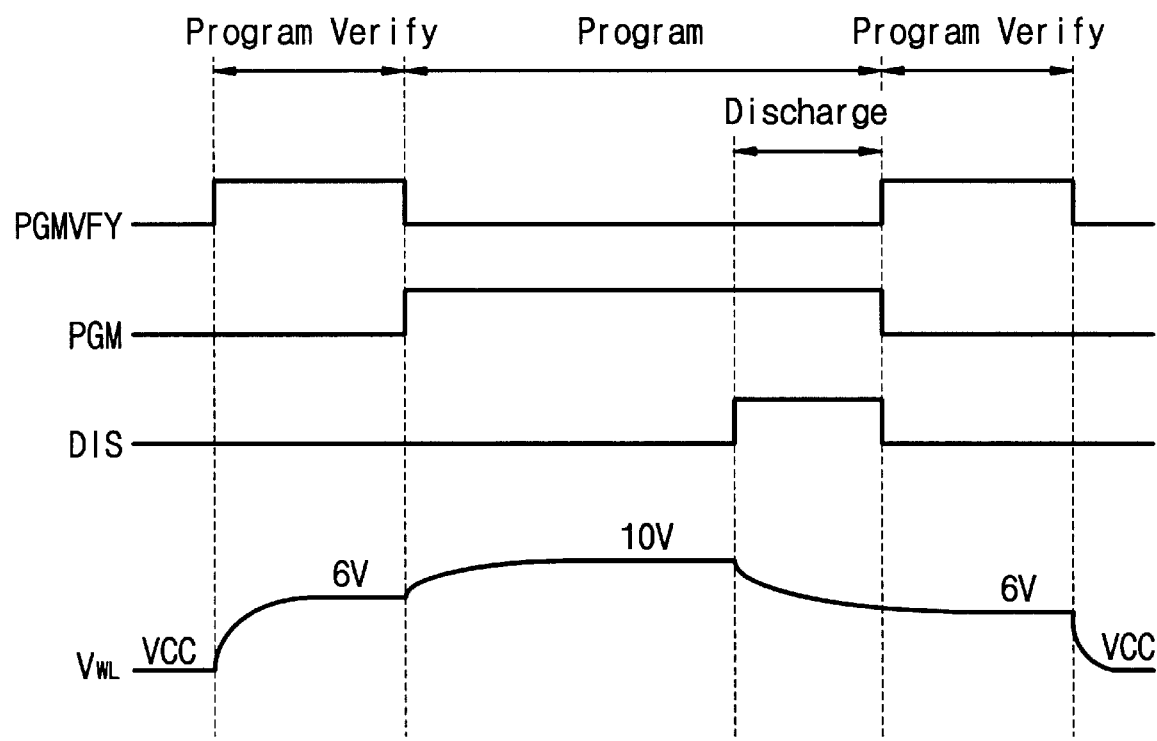
FIG. 7 is diagram showing word line voltage changes during a program mode for operation of a nonvolatile semiconductor memory device according to an embodiment of the present invention.

FIG. 7 is a diagram showing word line voltage during a program mode operation. A program operation according to the present invention will be more fully described below with reference to FIGS. 5 to 7 together with FIG. 3. For ease of description, a program operation associated with only one memory cell 101 will be described.

Figure 3:
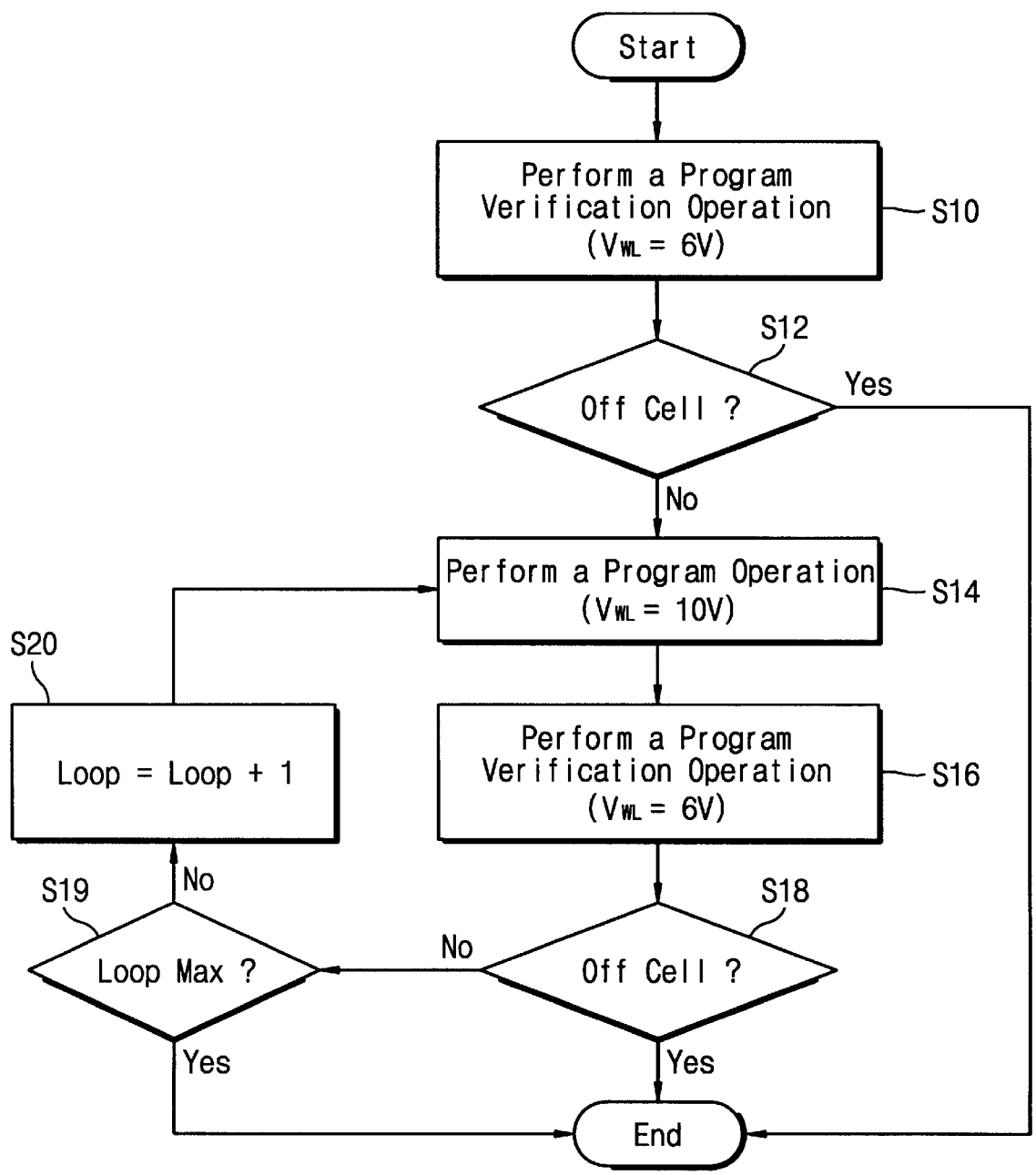
FIG. 3 is a flowchart showing a program operation for a conventional nonvolatile semiconductor memory device.
Figure 4:
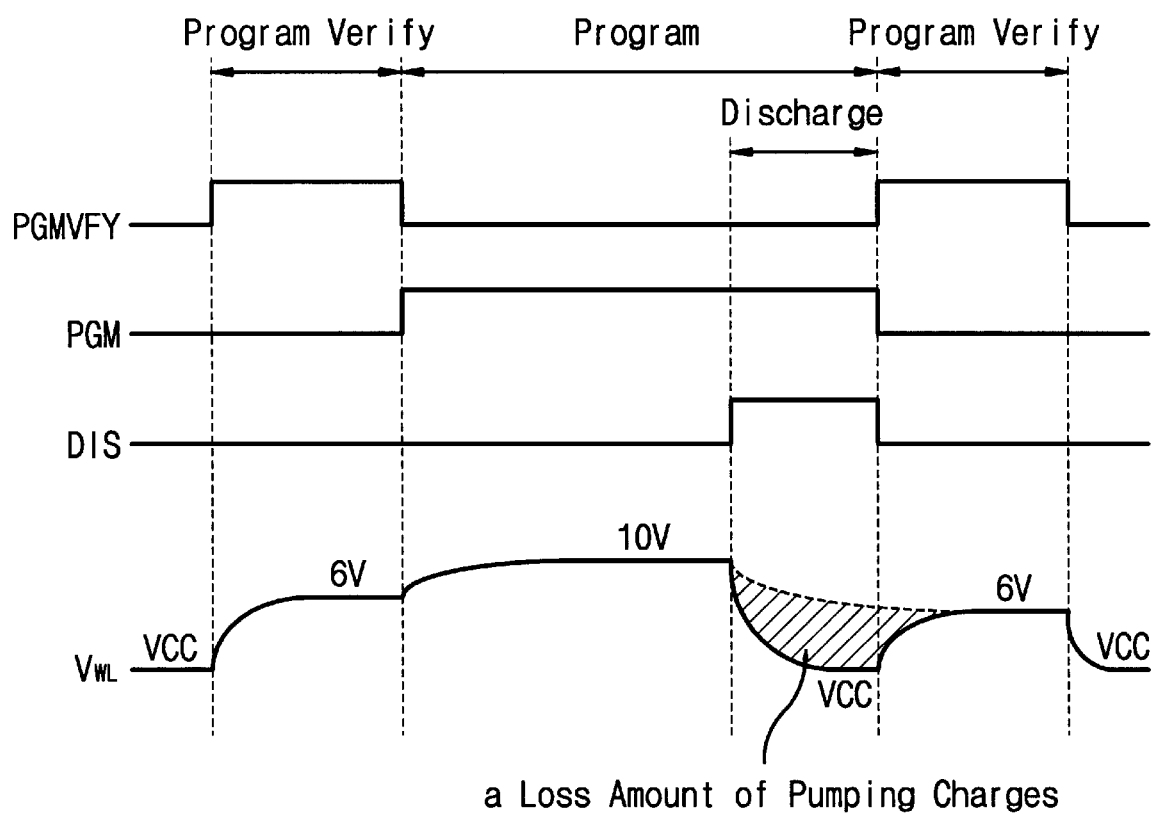
FIG. 4 is diagram showing word line voltage changes during a program mode of operation for a conventional nonvolatile semiconductor memory device.

When a program operation is initiated, a program verification operation is first performed in step S10 of FIG. 3, in order to discriminate whether a memory cell is to be programmed. Herein, in the case where the memory cell 101 is an on-cell, the threshold voltage of the memory cell should be between 1V and 3V. If the cell is an off-cell, its threshold voltage should be between 6V and 7V. During the program verification operation, a program verification voltage of, for example, about 6V is applied to a word line 102 to which the gate of the memory cell 101 is connected. At the same time, a sensing current is supplied onto a bit line 103 associated with the memory cell 101.

In particular, during step S10, the signals PGM and PGMVFY go low and high, respectively. This enables the mode setting signal generator 200 to signal a logic high on MODE causing PMOS transistor 109 of circuit 220 to turn off and PMOS transistor 110 thereof to turn on. Accordingly, the high voltage Vpp, set to a program verification voltage of about 6V, is supplied via turned-on transistor 110 and row decoder circuit 140 onto a word line 102 connected to memory cell 101.

Since the signal DIS remains low during step S10, PMOS transistor 113 of charge sharing circuit 240 is turned on and NMOS transistor 114 is turned off. This places both electrodes of capacitor 115 at approximately the same potential. According to the above-described condition of capacitor 115, the charge sharing circuit 240 doesn't affect the voltage (that is, the program verification voltage) on the word line 102.

In a subsequent step S12, it is discriminated whether the memory cell 101 is an off-cell. If it is an off-cell, the program operation is ended. In this case, the memory cell has a threshold voltage of about 6 to 7V, and the voltage level on the bit line 103 is sensed as higher than a previous precharged voltage level.

If the memory cell 101 is discriminated as an on-cell (i.e., it has a threshold voltage of about 1 to 3V and the voltage level on the bit line is sensed as lower than a previous precharged voltage level), the procedure goes to step S14. At step S14, a program operation is performed to set the threshold voltage of the memory cell 101 to about 6 to 7V, corresponding to an off-cell. During the program operation, a high voltage Vpp (that is, the program voltage) of about 10V is generated from high voltage generator 180 and supplied onto the word line 102 associated with the memory cell 101, and a voltage of about 5V is supplied to the bit line 103 associated with the memory cell 101. At this time, the source line 104 connected to the source of the memory cell 101 is grounded. Since the program operation of the present invention is identical to that of the conventional flash memory device, description thereof is thus omitted to avoid duplication.

As illustrated in FIG. 7, the voltage on word line 102 is discharged before the program operation of step S14 is ended (before the program verification operation of subsequent step S16 is performed). During the discharge operation, the signals PGM and PGMVFY continue to be high and low, respectively. This keeps PMOS transistor 110 active and PMOS transistor 109 inactive.

Furthermore, at the beginning of the discharge operation, the signal DIS transitions from a logic low level to a logic high level, as shown in FIG. 7. This makes PMOS transistor 113 of circuit 240 turn off and NMOS transistor 114 turn on, so that one electrode of capacitor 115 is connected to the output node OUTND and the other electrode is grounded via NMOS transistor 114. This enables charge (corresponding to the program voltage of about 10V) in load capacitor 116 to flow to capacitor 115 (i.e., a charge sharing operation between load capacitor 116 and capacitor 115 occurs). Since the effective capacitance of load capacitor 116 is increased (because load capacitor 116 and capacitor 115 are connected in parallel to each other), the voltage at the output node OUTND, that is, the program voltage (10V) on the word line 102 is lowered by $\Delta V(Q/\Delta C)$, down to the program verification voltage.

Herein, note that the high voltage Vpp is not output from the high voltage generator 180 during the discharge operation. It is obvious to ones skilled in the art that the voltage achieved on the word line 102 due to the charge-sharing operation is easily changed by adjusting the capacitance of the capacitor 115. As shown in FIG. 7, during the discharge operation, the flash memory device can obtain a program verification voltage of about 6V without charge loss by use of the charge sharing circuit 240.

In step S16, the program verification operation is performed again. During the program verification operation, the signals PGM and PGMVFY go low and high, respectively. This enables the mode setting signal generator 200 to signal a logic high on MODE, such that PMOS transistor 109 of circuit 220 is turned off and PMOS transistor 110 is turned on. Accordingly, the high voltage Vpp, that is, the program verification voltage of about 6V, from the high voltage generator 180 is supplied via turned-on transistor 110 and row decoder circuit 140 onto a word line 102 connected to the memory cell 101.

Since the signal DIS transitions from a logic high level to a logic low level at step S16, PMOS transistor 113 of charge sharing circuit 240 is turned on and NMOS transistor 114 is turned off. This ties both electrodes of the capacitor 115 to the output node OUTND, such that the charge sharing circuit 240 doesn't affect the voltage (that is, the program verification voltage) on the word line 102.

After the program verification operation is ended, it is discriminated in step S18 whether memory cell 101 is an off-cell. If memory cell 101 is an off-cell, the program operation is ended. Otherwise, the procedure goes to step S19, where it is determined whether the program operation has been performed a predetermined maximum number of times. If not, the steps S20, S14, S16, S18 and S19 are performed. Otherwise, the program operation is ended.

According to the present invention as described above, when the program verification operation is performed after a program operation, the program voltage on the word line is lowered to the program verification voltage by charge sharing between load capacitor 116 and capacitor 115 in circuit 240. Accordingly, the program verification voltage is rapidly obtained, without charge loss, so that power consumption by the present invention is decreased as compared with that of the conventional flash memory device.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor memory device comprising:

at least one word line to which a plurality of memory cells for storing data information are connected;

a voltage generating circuit having an output node, for receiving a power supply voltage and generating at least two output node voltages, each higher than the power supply voltage, in accordance with corresponding memory operations;

a voltage switching circuit for transferring the output node voltage corresponding to a selected memory operation onto the word line; and a charge sharing circuit connected to the output node of the voltage generating circuit such that, when the word line voltage corresponding to one memory operation is less than that corresponding to a previous memory operation, the charge sharing circuit reduces the word line voltage by charge sharing.

2. The semiconductor memory device according to claim 1, wherein said charge sharing circuit comprises:

a capacitor having first and second electrodes, the first electrode connected to the output node of the voltage generating circuit;

a first transistor having a current path connected across the capacitor electrodes, and a gate for receiving a control signal supplied through two serially-connected inverter circuits; and a second transistor having a current path connected between the second electrode and a ground, and a gate for receiving the control signal.

3. The semiconductor memory device according to claim 2, wherein the serially-connected inverter circuit connected directly to the gate of the first transistor comprises a level shift circuit.

4. The semiconductor memory device according to claim 2, wherein the capacitor electrodes are set to the same potential when the control signal is inactivated.

5. The semiconductor memory device according to claim 4, wherein when the control signal is activated, the first capacitor electrode assumes the voltage on the output node of the voltage generating circuit and the second capacitor electrode is grounded through the second transistor.

6. A semiconductor memory device comprising:

a memory cell array having a plurality of word lines, a plurality of bit lines arranged so as to cross the word lines, and a plurality of memory cells positioned at the word line/bit line crossings, each memory cell storing data information;

a row decoder circuit for selecting one of the word lines associated with a memory cell to drive the word line with a word line voltage in accordance with program, program verification, and read modes of operation;

a voltage generating circuit having an output node, for receiving a power supply voltage and generating as the word line voltage, a program voltage or a program verification voltage, higher than the power supply voltage;

a voltage switching circuit for transferring a voltage corresponding to a selected mode of operation onto the word line through the row decoder circuit; and a charge sharing circuit connected to the output node of the voltage generating circuit such that, when the word line voltage corresponding to one memory operation is less than that corresponding to a previous memory operation, the charge sharing circuit reduces the word line voltage by charge sharing.

7. The semiconductor memory device according to claim 6, wherein said charge sharing circuit comprises:

a capacitor having first and second electrodes, the first electrode connected to the output node of the voltage generating circuit;

a first transistor having a current path connected across the capacitor electrodes, and a gate for receiving a discharge enable signal supplied through two serially-connected inverter circuits and indicating discharge of a voltage on the word line; and a second transistor having a current path connected between the second electrode and a ground voltage and a gate for receiving the discharge enable signal.

8. The semiconductor memory device according to claim 7, wherein the serially-connected inverter circuit connected directly to the gate of the first transistor comprises a level shift circuit.

9. The semiconductor memory device according to claim 7, wherein the capacitor electrodes are set to have the same potential when the discharge enable signal is inactivated.

10. The semiconductor memory device according to claim 7, wherein when the discharge enable signal is activated, the first capacitor electrode assumes the voltage on the output node of the voltage generating circuit and the second capacitor electrode is grounded through the second transistor.

11. The semiconductor memory device according to claim 6, wherein said voltage switching circuit comprises:

a mode setting signal generator for generating a mode setting signal indicating one of the program, program verification, and read modes of operation in response to a program enable signal and a program verification enable signal;

a first level shifter circuit connected to an output of the mode setting signal generator;

a first transistor having a current path formed between the output node of the voltage generating circuit and the row decoder circuit and a gate connected to the output of the first level shifter circuit;

a second level shifter circuit connected to the output of the first level shifter circuit; and a second transistor having a current path formed between the power supply voltage and the row decoder circuit and a gate connected to an output of the second level shifter circuit.

12. A flash memory device comprising:

memory cell array having a plurality of word lines, a plurality of bit lines arranged so as to cross the word lines, and a plurality of memory cells positioned at the word line/bit line crossings and each storing data information, wherein each of the memory cells has a control gate connected to a corresponding word line, a floating gate, a source terminal connected to a ground, and a drain terminal connected to a corresponding bit line;

a row decoder circuit for selecting one of the word lines associated with a memory cell to drive the word line with a word line voltage in accordance with program, program verification, and read modes of operation;

a voltage generating circuit having an output node, for receiving a power supply voltage and generating as the word line voltage, a program voltage or a program verification voltage, both higher than the power supply voltage;

a mode setting signal generating circuit for generating a mode setting signal indicating one of the program, program verification, and read modes of operation in response to a program enable signal and a program verification enable signal;

a voltage switching circuit responsive to the mode setting signal, for transferring either the power supply voltage or the voltage generating circuit output voltage onto the selected word line through the row decoder circuit; and a charge sharing circuit connected to the output node of the voltage generating circuit, such that when the word line voltage corresponding to one memory operation is less than that corresponding to a previous memory operation, the charge sharing circuit reduces the word line voltage by charge sharing.

13. The flash memory device according to claim 12, wherein said charge sharing circuit comprises:

a capacitor having first and second electrodes, the first electrode connected to the output node of the voltage generating circuit;

a first transistor having a current path connected across the capacitor electrodes, and a gate for receiving a discharge enable signal supplied through two serially-connected inverter circuits; and a second transistor having a current path connected between the second electrode and a ground voltage, and a gate for receiving the discharge enable signal.

14. The flash memory device according to claim 13, wherein one of said serially-connected inverter circuits connected directly to the gate of the first transistor is comprised of a level shift circuit.

15. The flash memory device according to claim 13, wherein the capacitor electrodes are set to the same potential when the discharge enable signal is inactivated.

16. The flash memory device according to claim 13, wherein when the discharge enable signal is activated, the first capacitor electrode assumes the voltage on the output node of the voltage generating circuit and the second capacitor electrode is grounded through the second transistor.

* * * * *